US006181161B1

(12) United States Patent
Rangasayee et al.

(10) Patent No.: US 6,181,161 B1
(45) Date of Patent: Jan. 30, 2001

(54) APPARATUS AND METHOD FOR VERIFYING MACROCELL BASE FIELD PROGRAMMABLE LOGIC DEVICES

(75) Inventors: Krishna Rangasayee, Mountain View; Brad Ishihara, Sunnyvale; Kunio Nishiwaki, San Jose, all of CA (US)

(73) Assignee: Altera Corporation, San Jose, CA (US)

( * ) Notice: Under 35 U.S.C. 154(b), the term of this patent shall be extended for 0 days.

(21) Appl. No.: 09/340,331

(22) Filed: Jun. 28, 1999

Related U.S. Application Data

(60) Provisional application No. 60/091,049, filed on Jun. 29, 1998.

(51) Int. Cl.[7] ....................................................... G06F 7/38
(52) U.S. Cl. ............................................. 326/40; 365/154
(58) Field of Search ........................... 395/309; 365/154; 326/40

(56) References Cited

U.S. PATENT DOCUMENTS 5,761,460 * 6/1998 Santos et al. ........................ 395/309

* cited by examiner

Primary Examiner—David Nelms
Assistant Examiner—M Tran
(74) Attorney, Agent, or Firm—Pennie & Edmonds LLP

(57) ABSTRACT

A method of programming and verifying a macroscale based architecture in a field programmable logic device includes the step of selecting a flip-flop. The flip-flop contains a programmable address that accepts a sequence of instructions. A Switch Controller then selectably enables either one of two banks of switches. If the first bank of switches is selected, the programming operation is selected. If the second bank of switches is enabled, the verification operation is selected. The verification operation includes the step of automatically incrementing a base address through a set of incremented addresses. For each incremented address produced by the incrementing step, a margin low operation is performed with a Level Tester Array and a margin high operation is performed with a Level Tester Array. Thus, unlike the prior art, margin operations with the present invention are performed without using a macrocell scan register. Advantageously, relatively large groups of data are loaded into the flip-flops in the ADSR to improve processing.

17 Claims, 4 Drawing Sheets

APPARATUS AND METHOD FOR VERIFYING MACROCELL BASE FIELD PROGRAMMABLE LOGIC DEVICES

This application claims priority to the provisional patent application entitled "Apparatus and Method for Verifying Macrocell Based Field Programmable Logic Devices," Ser. No. 60/091,049, filed Jun. 29, 1998.

BRIEF DESCRIPTION OF THE INVENTION

This invention relates generally to field programmable logic devices. More particularly, this invention relates to an improved technique for programming and verifying macrocell based field programmable logic devices.

BACKGROUND OF THE INVENTION

FIG. 1 illustrates a prior art programming and verification scheme used in field programmable logic devices. In a typical embodiment of FIG. 1 Array Data Shift Register (ADSR) Select Circuit 122 is programmed to select individual flip-flops 102A–102N in ADSR 104. Once selected, individual flip-flops 102A–102N are enabled and can accept programming in the form of data or sequential instructions. Each flip-flop 102A–102N contains at least one programmable bit. The programmable bit is programmed when data is input to the D-input of selected flip-flop(s) 102A–102N. The programmable bits, taken together, can define at least one programmable address in ADSR 104. After data is input to flip-flops 102A–102N, control for the program is transferred from ADSR 104 to Product-Term Logic Gates 112A–112N. Program Mode Controller 127 sets the Product-Term Logic Gates' second input to a logical "1" while the circuit is being programmed. (This second input is used as a data line after the circuit is programmed and while it is being used by a user.) These programming operations must be carried out in a serial fashion, completely loading the data into one of the selected flip-flops before loading the next. Also, the structural limitations associated with prior art macrocell devices, such as that shown and described in FIG. 1, are such that in order to expand the circuit's capability a typical prior art circuit may have a mirrored (or second identical) macrocell also using MSR 126. In such a case, programming and verification steps take twice as long because the same operation must be serially processed through MSR. This serial limitation occurs because all of the data entered into any system component must be combined in Gate 124, then processed through Macrocell Scan Register (MSR) 126, and MSR 126 accepts only one piece of data at a time.

Once the programming operation is complete, in the usual case a verification operation is performed. Level Tester 106 performs the verification operation by performing a Margin High and a Margin Low test on signals from MSR 126. Margin High and Margin Low operations are stress tests designed to test a line or address at its upper and lower extremes. One skilled in the art would be familiar with suitable methods of level testing, including but not limited to using shift registers.

The problem with this prior art approach is that all programming operations must be executed in a serial fashion because the processing is executed through MSR 126. In addition to the increased time required by serial processing, this type of processing requires a relatively large number of test vectors. These factors can result in large memory load times when a device is being tested with automatic test equipment. The large number of test vectors is especially problematic in the case of in-system programming of embedded controllers. That is, to support in-system programming, a relatively large amount of memory is required to store the vectors associated with the verification process.

In view of the foregoing, it would be highly desirable to provide an improved verification scheme for macrocell based architectures in field programmable logic devices. Ideally, the scheme would reduce the number of required vectors and eliminate the need for an MSR. As a result, in-system programming via an embedded controller could be performed with reduced memory requirements. In addition, test time associated with automatic test equipment would be reduced.

SUMMARY OF THE INVENTION

A method of programming and verifying a macroscale based architecture in a field programmable logic device includes the step of selecting a flip-flop. The flip-flop contains a programmable bit that accepts data. A Switch Controller then selectably enables either one of two banks of switches. If the first bank of switches is selected, the programming operation is selected. If the second bank of switches is enabled, the verification operation is selected. The verifying operation includes the step of automatically incrementing a base address through a set of incremented addresses. For each incremented address produced by the incrementing step, a margin low operation is performed with a Level Tester and a margin high operation is performed with the Level Tester. Thus, unlike the prior art, margin operations with the present invention are performed without using a macrocell scan register. Advantageously, processing is improved because relatively large groups of data are loaded into flip-flops in the ADSR. And, these large data groups can be processed at the same time, rather than in a serial fashion as in the prior art.

The invention provides a programming and verification scheme for macrocell based architectures in field programmable logic devices. The invention reduces the number of vectors that are processed during verification. As a result, in-system programming via an embedded controller is performed with reduced memory requirements. Also, this invention eliminates the need for an output shift register. Further, testing time associated with automatic test equipment is reduced.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
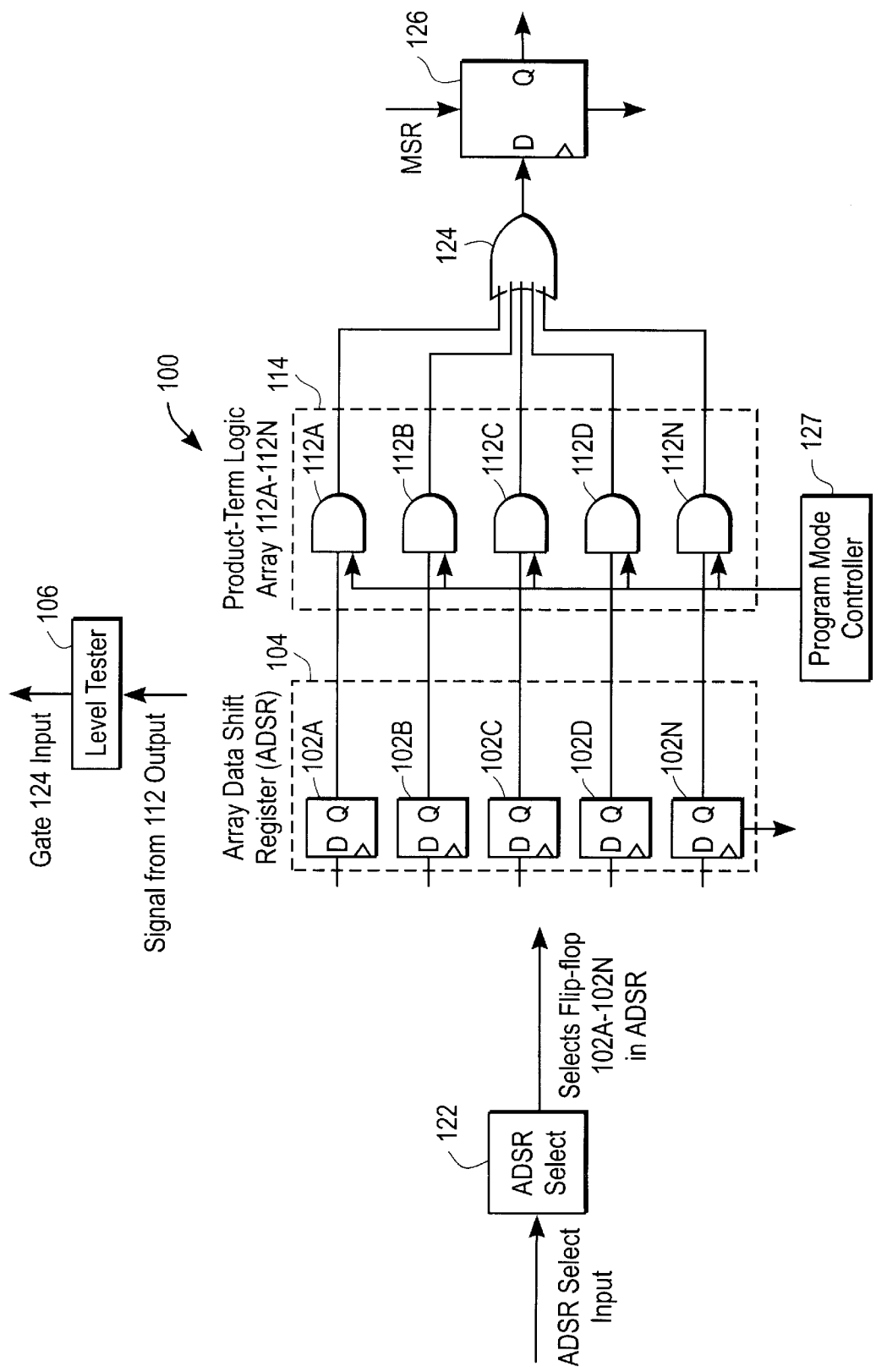
FIG. 1 illustrates a prior art programming and verification circuit for macrocell based architectures in field programmable logic devices.
Figure 2:
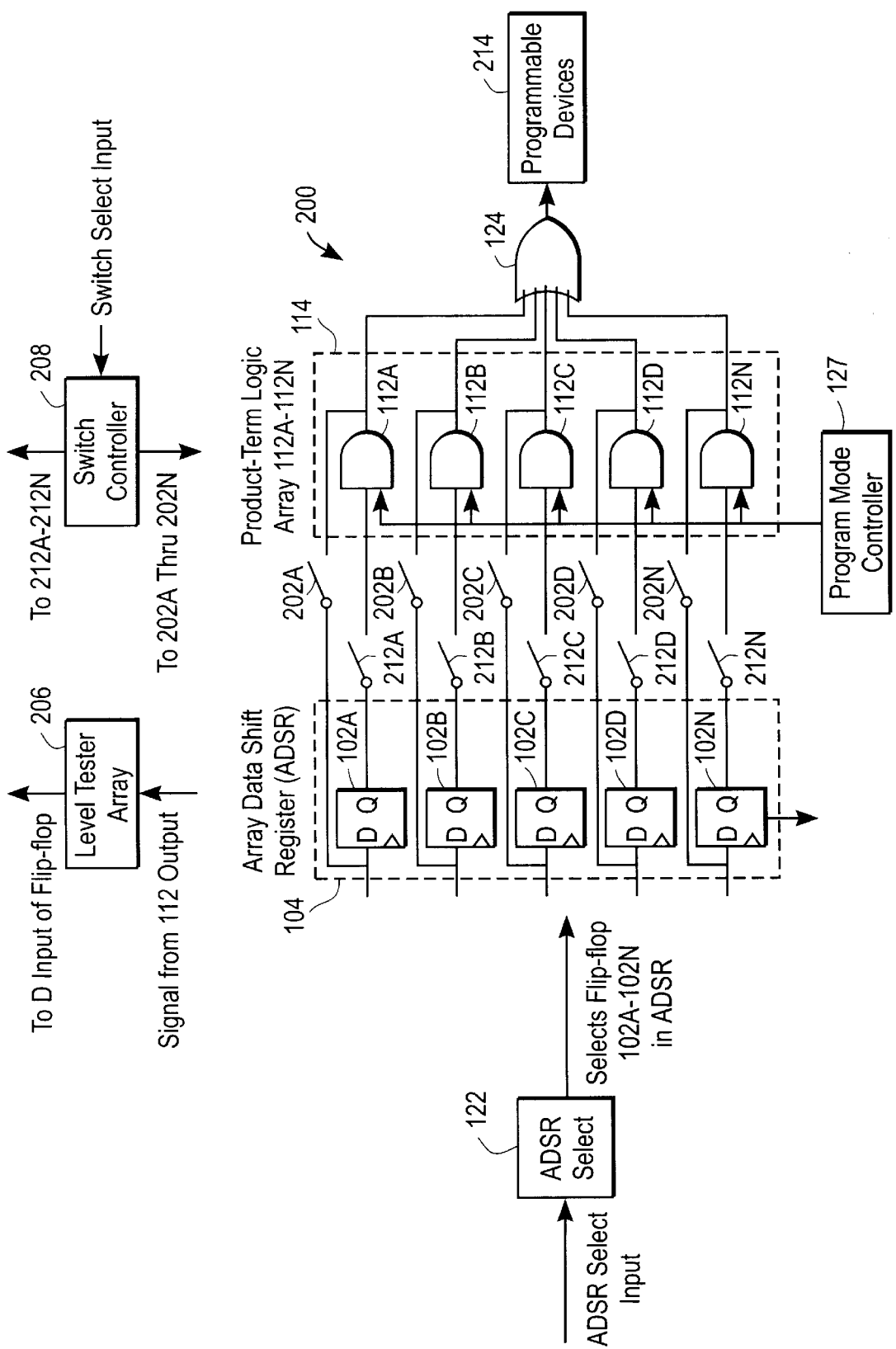
FIG. 2 illustrates a programming and verification circuit for macrocell based architectures that may be used in accordance with an embodiment of the invention.

FIG. 2 illustrates a programming and verification circuit 200 for macrocell based architectures that may be used in accordance with an embodiment of the invention. Unlike prior art programming and/or verification schemes, such as that shown in FIG. 1, the circuit of the invention does not rely upon a macrocell scan register (MSR) 126.

The invention illustrated in FIG. 2 performs two operations. The first operation is to program flip-flops 102A–102N in ADSR 104 and Product-Term Logic Gates 112A–112N in Product-Term Logic Array 114. The second operation verifies the programming by using Level Tester Array 206 to test signal strength.

In one embodiment of the invention, ADSR Select Circuit 122 selects flip-flops 102A–102N within ADSR 104, thereby enabling flip-flops so that they may accept, process, and deliver data. Each flip-flop 102A–102N includes at least one programmable bit that can be programmed by receiving a sequence of instructions in the form of data when that flip-flop is selected. Each flip-flop 102A–102N may have more than one internal programmable bit. The programmable bits in flip-flops 102A–102N may define a programmable address in ADSR 104. Importantly, more than one flip-flop 102A–102N can be selected at the same time. When more than one flip-flop 102A–102N is selected at the same time, these multiple flip-flops can process data in parallel, rather than waiting to process the information in a serial fashion as was done in the prior art. After ADSR Select Circuit 122 provides the information for selecting desired flip-flop(s) 102A–102N, within ADSR 104, ADSR 104 is programmed by inputting a sequence of instructions into input D of the selected flip-flops.

Switch Controller 208 is capable of selecting between the programming operations of the circuit and the verification operation of the circuit by selecting one of two banks of switches. Namely, Switch Controller 208 may select to close either switches 202A–202n thereby engaging the circuit's verification operation, or Switch Controller 208 may select to close switches 212A–212N thereby engaging the circuit's programming operation. Thus, to select the programming operation, Switch Controller 208 selects to close switches 212A–212N connecting the Q output of flip-flops 102A–102N to the input of Product-Term Logic Gates 112A–112N. One skilled in the art would be familiar with any number of suitable switches for making such a connection. By selecting switches 212A–212N, Switch Controller 208 allows the programming control to be transferred from ADSR 104 to Product-Term Logic Gates 112A–112N. Program Mode Controller 127 provides a second input to Product-Tern Logic Gates 112A–112N. Also, during both the programming and verification operation of the circuit this input is set to a logical "1." (After the circuit is programmed and verified, Program Mode Controller 127 makes this second input available as a data input.) Advantageously, the transfer of programming control from ADSR 104 to Product-Term Logic Gates 112A–112N can be achieved in a parallel operation. This parallel processing is possible because the transfer of data is no longer limited to the speed of the throughput of one MSR 126, as in the prior art. Instead, each flip-flop 102A–102N in combination with switches 212A–212N, as selected by Switch Controller 208 and Product-Term Logic Gates 112A–112N provide multiple paths for parallel processing of information thereby improving the overall transfer speed of the circuit operation and transfer of the program. After transferring the program control from ADSR 104 to Product-Term Logic Gates 112A–112N, Switch Controller 208 instructs switches 212A–212N to open, thereby breaking the data transfer path between output D of flip-flop 102A–102N and Product-Term Logic Gates 112A–112N.

In one embodiment of the invention, the programming is verified by testing signal strength. The signal strength test is initiated when Switch Controller 208 instructs switches 202A–202n to close thereby connecting the output of Product-Term Logic Gates 112A–112N to input D of flip-flop 102A–102N. Also, closing switches 202A–202n enables Level Tester Array 206. Once Level Tester Array 206 is enabled, a set of incremental addresses is identified for testing. This set of incremental addresses includes the programmable addresses internal to ADSR 104. Level Tester Array 206 performs a signal strength test by performing a Margin High operation and a Margin Low operation on each successive incremental address. In a serial fashion, once an incremental address is tested for both Margin High operation and Margin Low operation, Level Tester Array 206 automatically increments programmable address locations to the next incremental address. These steps of testing and incrementing are repeated until all incremental addresses in the set of incremental addresses are tested. One skilled in the art would be familiar with methods of automatically incrementing addresses. Such methods include, but are not limited to using a shift register such as an ADSR. Further, one skilled in the art would be familiar with Margin High and Margin Low testing whereby a product, component, gate, line, address or the like may be tested for operating performance at both high and low operating conditions. Margin High and Margin Low testing is essentially a stress test verifying that the tested item will operate normally at both high and low operating conditions. After sequentially incrementing and testing the entire set of incremental addresses, Switch Controller 208 instructs switches 202A–202n to open thereby disconnecting the connection between input D of flip-flops 102A–102N and the output of Product-Term Logic Gates 112A–112N. Disconnecting switches 202A–202n also disables Level Tester Array 206.

After completing both the programming operation and the verification operation, the resulting data stored in each Product-Term Logic Gates 112A–112N located in Product Term Logic Array 114 may be sequentially sent to Gate 124 and delivered to Programmable Devices 214.

Thus, the invention provides a method of programming and verifying a macroscale based architecture in a field programmable logic device by allowing flip-flops 102A–102N in ADSR 104 to be programmed in parallel, rather than in series as in the prior art, and by automatically incrementing programmable addresses through a set of incremented addresses. For each incremented address produced by the incrementing step, a Level Tester Array 206 performs a Margin High operation and a Margin Low operation to test the signal strength at that address. While there are many ways to achieve the desired level testing, a preferred method is to use a data shift register automatically incrementing the set of incremental addresses, which includes the programmable address(es). Observe that unlike the prior art, margin operations are performed without the use of a MSR 126. Further observe that relatively large groups of data are loaded into the flip-flops 102A–102N in ADSR 104, improving processing.

Figure 3:
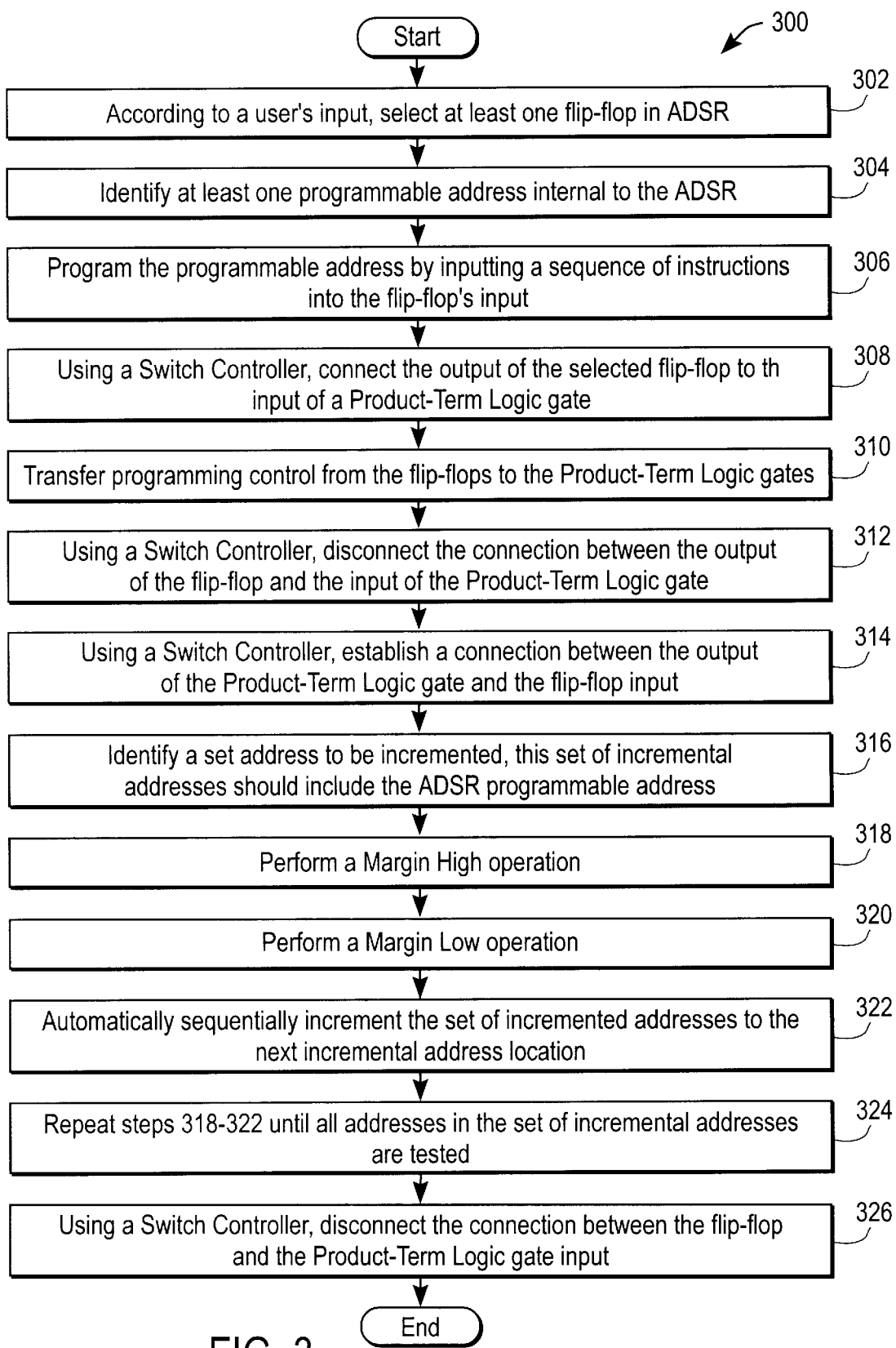
FIG. 3 is a flow chart demonstrating steps that may be used in accordance with an embodiment of the invention.

FIG. 3 illustrates a flow chart describing the steps of a system in accordance with an embodiment of the invention. The steps of the system may be broken down into two main operations. Steps 302 through 312 make up the "programming" operation, and steps 314 through 326 provide the "verification" operation.

In one embodiment of the invention, the programming operation is achieved by performing steps 302 through 312. A user sets instructions delivered to the circuit through ADSR Select Circuit 122, selecting which flip-flops 102A–102N in ADSR 104 will be activated (step 302). One skilled in the art would be familiar with a multitude of methods for selecting flip-flops 102A–102N. For example, a user may use hardware, software, firmware of the like to provide instruction for selecting flip-flops 102A–102N according to the circuit needs and programming goals. Once flip-flops 102A–102N are selected, at least one programmable address is identified in ADSR 104. The programmable address identified in ADSR 104 is made up of the programmable bits from flip-flops 102A–102N. (step 304). The programmable address is programmed when a sequence of instructions is input to the input of selected flip-flops 102A–102N (step 304). Next, Switch Controller 208 closes switches 212A–212N thereby connecting the Q output of selected flip-flop(s) 102A–102N to Product-Term Logic Gates 112A–112N inputs (step 308). In a preferred embodiment, the connection between the output of selected flip-flops 102A–102N and the inputs of Product-Term Logic Gates 112A–112N is a detachable connection such as a switch or the like. One skilled in the art would be familiar with suitable switches for such a detachable connection. At a next step, control over the program loaded in the programmable addresses internal to flip-flops 102A–102N is transferred to Product-Term Logic Gates 112A–112N (step 310). Then, Switch Controller 208 disables the transfer of program control by opening switches 212A–212N thereby disconnecting the connection between the output of flip-flops 102A–102N and the input of Product-Tern Logic Gates 112A–112N, thus concluding the programming operation (step 312).

The verification operation is achieved in steps 314 through 326. First, Switch Controller 208 closes switches 202A–202n establishing a connection between the output of Product-Term Logic Gates 112A–112N and the input of flip-flops 102A–102N (step 314). The connections are preferably detachable connections and may be made in response to a user input. After establishing the connection between the input of flip-flops 102A–102N and the output of Product-Term Logic Gates 112A–112N, Level Tester Array 206 is enabled and a set of incremental addresses is identified (step 316). This set of incremental addresses should include the programmable addresses internal to ADSR 104. Next, level testing is performed. A Margin High operation is performed on the first selected incremental address (step 318), and a Margin Low operation is performed on the same incremental address (step 320). Once an address has been tested at Margin High and Margin Low, the set of incremental addresses is automatically and sequentially incremented to the next incremental addresses (step 322). Steps 318 through 322 are repeated until each incremental address is tested (step 324). Finally, Switch Controller 208 disconnects the connection between the output of Product-Term Logic Gates 112A–112N and the input of flip-flops 102A–102N, thereby terminating level testing (step 326).

The pseudo code shown below corresponds to the structure shown in FIG. 3. The first set of pseudo code shows the programming operation and the second set shows the verification operating as described in FIG. 3:

Begin Routine for Programming Operation

Select at least one flip-flop 102A–102N
   Select a programmable bit, located in the selected flip-flop 102A–102N
Program the ADSR 104
   Input a sequence of instruction to the D input of selected flip-flop 102A–102N
   Programmable bits from selected flip-flops 102A–102N make up at least one programmable address in ADSR 104
Connect flip-flop 102A–102N output to Product-Term Logic Gates 112A–112N input
Transfer programming control from ADSR 104 to Product-Term Logic Gates
Terminate connections End Programming Operation The verification scheme of the invention, as described in FIG. 3, may be characterized by the following pseudo code:

BEGIN ROUTINE FOR VERIFICATION OPERATION

Connect Product-Term Logic Gate 112A–112N output to flip-flops 102A–102N input Runtest Identify a set of incremental addresses for I=1 to last__ address__location [auto-increment address]
   Margin High
     Select flip-flop 102A–102N
     Load Data from all 5 Product-Term Logic gates 112A–112N to flip-flops 102A–102N
   Margin Low
     Select flip-flop 102A–102N
     Load Data from all 5 from all 5 Product-Term Logic gates 112A–112N to flip-flops 102A–102N

Runtest

Terminate connection end for;

End Verification Operation

Embodiments of the invention reduce the number of vectors to approximately 38% of their original size. Those skilled in the art will appreciate that the invention reduces file sizes. Also, the invention eliminates the need for a macrocell scan register. When utilizing the invention, memory requirements are reduced for in-system programming via embedded controllers. The invention also reduces memory load time when using automatic test equipment. As a result, test time costs are also lowered.

Figure 4:
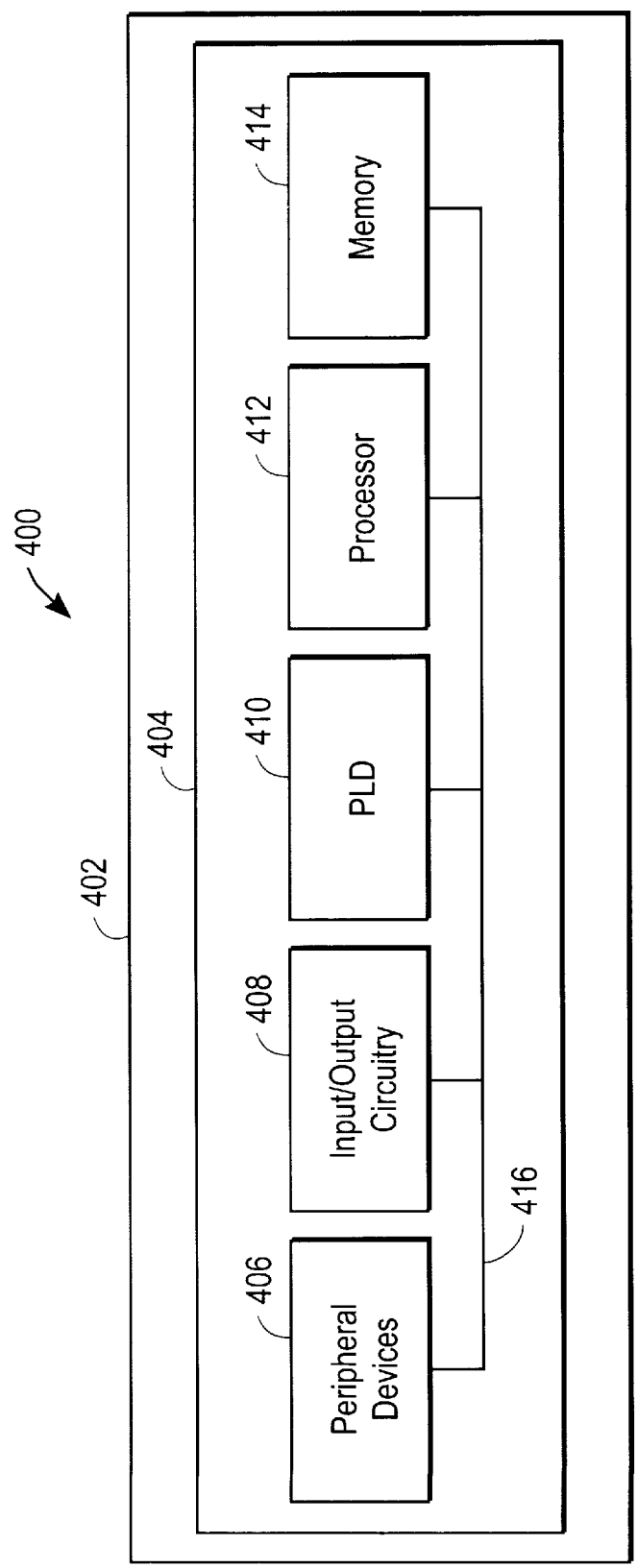
FIG. 4 illustrates a digital system incorporating a programmable logic device with the programming and verification scheme of the invention.

FIG. 4 illustrates a programmable logic device (PLD) 410 incorporating the verification scheme of the invention. PLD 410 forms a part of a data processing system 400. Data processing system 400 may include one or more of the following components: a processor 412, a memory 414, input/output circuitry 408, and peripheral devices 406. These components are coupled together by a system bus 416 and are populated on a circuit board 404, which is contained in an end-user system 402.

The system 400 can be used in a wide variety of applications, such as computer networking, data networking, instrumentation, video processing, digital signal processing, or any other application where the advantage of using re-programmable logic is desirable. PLD 410 can be used to perform a variety of logic functions. For example, PLD 410 can be configured as a processor or controller that works in cooperation with processor 412. PLD 410 may also be used as an arbiter for arbitrating access to a shared resource in system 400. In yet another example, PLD 410 can be configured as an interface between processor 412 and one of the other components in system 400.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A method of programming a macroscale based architecture in a field programmable logic device, said method comprising the steps of:

selecting a flip-flop from an array of flip-flops, wherein said flip-flop contains a programmable bit;

programming said programmable bit with a sequence of instructions;

establishing a first connection between said flip-flop and a Product-Term Logic Gate;

transferring programming control from said flip-flop to said Product-Term Logic Gates; and disconnecting said first connection between said flip-flop and said Product-Term Logic Gate thereby ending the transferring of programming control.

2. The method of claim 1, wherein said flip-flop contains more than one said programmable address.

3. The method of claim 1, wherein more than one said flip-flop is selected, further comprising the step of:

programming said more than one said flip-flop at the same time.

4. The method of claim 1, further comprising the steps of:

establishing a second connection between said flip-flop and said Product-Term Logic Gates;

combining said programmable bits to create a programmable address in said array of flip-flops;

identifying a set of incremental addresses such that said set of incremental addresses includes said programmable address;

level testing incremental addresses by performing a margin high operation and a margin low operation at each incremental address; and automatically incrementing said set of incremental addresses after both said margin high and margin low operations are performed on any one said incremental address.

5. The programmable macroscale based logic device of claim 1, wherein said flip-flop contains more than one said programmable bit.

6. A programmable macroscale based logic device, comprising:

at least one flip-flop, said at least one flip-flop having an input and an output and containing a programmable bit;

an Array Data Shift Register (ADSR), said ADSR being made up of said at least one flip-flop and containing a programmable address, said programmable address being made up of said programmable bits, said programmable address being programmed when a sequence of instructions is transmitted to said programmable bit;

a Product-Term Logic Gate, said Product-Term Logic Gate having an input and an output; and a Switch Controller, said Switch Controller capable of selecting between a first detachable connection and a second detachable connection, wherein said first detachable connection connects said at least one flip-flop output with said Product-Term Logic Gate input, and said second detachable connection connects said at least one flip-flop input with said Product-Term Logic Gate output.

7. The programmable macroscale based logic device of claim 6, wherein said Switch Controller selects to detachably connect said first detachable connection, further comprising:

a sequence of instructions for programming said programmable address in said ADSR, said programmable address being programmed by loading said sequence of instructions into said at least one flip-flop input, and control of said programming being transferred from said ADSR to said Product-Term Logic Gate.

8. The programmable macroscale based logic device of claim 7, wherein said Switch Controller disconnects said first detachable connection thereby ceasing the transfer of programming control from said ADSR to said Product-Term Logic Gates.

9. The programmable macroscale based logic device of claim 7, wherein said Switch Controller selects to detachably connect said second detachable connection, further comprising:

a set of incremental addresses, wherein said set of incremental addresses includes said programmable address; and a Level Tester Array capable of performing a margin high operation and a margin low operation at each incremental address before automatically incrementing said set of incremental addresses to the next incremental address.

10. The programmable macroscale based logic device of claim 9, wherein said second detachable connection is disconnected, thereby disabling said Level Tester Array.

11. A system with a programmable logic device, comprising:

a user programmable logic device including:

at least one flip-flop, said at least one flip-flop having an input and an output and containing a programmable bit;

an Array Data Shift Register (ADSR), said ADSR being made up of said at least one flip-flop and containing a programmable address, said programmable address being made up of said programmable bits, said programmable address being programmed when a sequence of instructions is transmitted to said programmable bit;

a Product-Term Logic Gate, said Product-Term Logic Gate having an input and an output; and a Switch Controller, said Switch Controller capable of selecting between a first detachable connection and a second detachable connection, wherein said first detachable connection connects said flip-flop output with said Product-Term Logic Gate input, and said second detachable connection connects said flip-flop input with said Product-Term Logic Gate output; and a system bus connected to said user programmable logic device for communicating with a system element connected to said system bus.

12. The system of claim 11, wherein said Switch Controller selects to detachably connect said first detachable connection, further comprising:

a sequence of instructions for programming said programmable address in said ADSR, said programmable address being programmed by loading said sequence of instructions into said at least one flip-flop input, and control of said programming being transferred from said ADSR to said Product-Term Logic Gate.

13. The system of claim 12, wherein said Switch Controller disconnects said first detachable connection thereby ceasing the transfer of programming control from said ADSR to said Product-Term Logic Gate.

14. The system of claim 13, wherein said flip-flop contains more than one said programmable bit.

15. The system of claim 14, wherein said Switch Controller selects to detachably connect said second detachable connection, further comprising:

a set of incremental addresses, wherein said set of incremental addresses includes said programmable address; and a Level Tester Array capable of performing a margin high operation and a margin low operation at each incremental address before automatically incrementing said set of incremental addresses to the next incremental address.

16. The system of claim 15, wherein said Switch Controller disconnects said second detachable connection thereby disabling said Level Tester Array.

17. The system of claim 16, wherein said system element is selected from the group consisting of: a peripheral device, an input/output device, a microprocessor, and an external memory device.

* * * * *